United States Patent
Tamaki et al.

(10) Patent No.: US 10,278,303 B2
(45) Date of Patent: Apr. 30, 2019

(54) ELECTRONIC APPARATUS

(71) Applicant: Sony Interactive Entertainment Inc., Tokyo (JP)

(72) Inventors: Yuta Tamaki, Chiba (JP); Yasuhiro Ootori, Kanagawa (JP)

(73) Assignee: Sony Interactive Entertainment Inc., Tokyo (JP)

(*) Notice: Subject to any disclaimer, the term of this patent is extended or adjusted under 35 U.S.C. 154(b) by 0 days.

(21) Appl. No.: 15/661,203

(22) Filed: Jul. 27, 2017

(65) Prior Publication Data

US 2018/0042135 A1 Feb. 8, 2018

(30) Foreign Application Priority Data

Aug. 2, 2016 (JP) .................. 2016-152222

(51) Int. Cl.
*H05K 7/20* (2006.01)
*A63F 13/90* (2014.01)

(52) U.S. Cl.
CPC ......... *H05K 7/20145* (2013.01); *A63F 13/90* (2014.09); *H05K 7/20181* (2013.01)

(58) Field of Classification Search
CPC .. H05K 7/20; H05K 7/20145; H05K 7/20209; H05K 7/20136; H05K 5/0013; G06F 1/20; H01L 23/34
USPC ........................................................ 361/690
See application file for complete search history.

(56) References Cited

U.S. PATENT DOCUMENTS

| | | | |
|---|---|---|---|
| 6,362,958 B1* | 3/2002 | Yu | G06F 1/20 165/104.34 |
| 2007/0190926 A1 | 8/2007 | Lu | |
| 2008/0121107 A1 | 5/2008 | Pfannenberg | |
| 2011/0005177 A1* | 1/2011 | Pfannenberg | B01D 45/08 55/385.1 |
| 2013/0067875 A1* | 3/2013 | Hartmann | B01D 46/0004 55/428 |
| 2014/0102867 A1* | 4/2014 | Inoue | B60N 2/0228 200/337 |

(Continued)

FOREIGN PATENT DOCUMENTS

| | | |
|---|---|---|
| JP | 01172226 U | 12/1989 |
| JP | 2005091674 A | 4/2005 |

(Continued)

OTHER PUBLICATIONS

European search Report for corresponding EP Application No. 17183764.4, 9 pages, dated Sep. 27, 2017.

(Continued)

*Primary Examiner* — Mandeep S Buttar
(74) *Attorney, Agent, or Firm* — Matthew B. Dernier, Esq.

(57) ABSTRACT

An electronic apparatus includes a first member having an opening through which air passes, the opening in a first direction, and a second member mounted to an outside of the first member. The second member includes a plurality of guide portions disposed in juxtaposition with each other in a second direction that extends orthogonally to the first direction when viewed in the first direction, the guide portions guiding air flowing through the opening. At least one guide portion out of the plurality of guide portions includes an engagement portion to be hooked onto the first member. The second member is mounted to the first member through the engagement portion.

13 Claims, 5 Drawing Sheets

(56) References Cited

U.S. PATENT DOCUMENTS

2014/0362529 A1* 12/2014 Tsuchida ............ H05K 7/20127
361/690

FOREIGN PATENT DOCUMENTS

| JP | 2013059138 A1 | 3/2013 |
| JP | 2013221708 A | 10/2013 |
| JP | 2014239167 A | 12/2014 |
| WO | 2008001396 A1 | 1/2008 |

OTHER PUBLICATIONS

Notification of Reasons for Refusal for corresponding JP Application No. 2016152222, 8 pages, dated May 8, 2018.

* cited by examiner

ELECTRONIC APPARATUS

BACKGROUND

The present disclosure relates to an electronic apparatus in which a heat generating part is cooled by air.

Some electronic apparatuses such as gaming machines and personal computers have an opening for exhausting to the outside air that is exposed to heat generated by an integrated circuit mounted on a circuit substrate. The electronic apparatus disclosed in Japanese Patent Laid-Open No. 2014-239167 (hereinafter referred to as Patent Document 1) includes a plurality of plate-shaped guides in the opening (in Patent Document 1, the guides are referred to, for example, as a "louver" and a "support portion"). The guides guide an air flow and prevent the inside of the electronic apparatus from being exposed to the outside through the opening. In Patent Document 1, the guides are integrally molded with an external member of the electronic apparatus (in Patent Document 1, the external member is referred to as a "frame").

SUMMARY

Some design of the electronic apparatus makes it difficult to mold the guides integrally with the external member. Molding a member that includes a plurality of guides separately from the external member imposes a challenge on a structure for mounting the member including the guides to the external member. Using, for example, a screw or a similar fastener to mount the member including the guides to the external member may increase the number of assembly steps of the electronic apparatus or degrade aesthetic appearance of the electronic apparatus because of the faster being exposed to the outside. A large-sized opening may require that a plurality of fasteners be placed for mounting. The structure utilizing fasteners is thus particularly not preferable.

It is desirable to provide an electronic apparatus that allows a member including a guide to be mounted to the electronic apparatus, while reducing an effect on appearance of the electronic apparatus.

According to an embodiment of the present disclosure, there is provided an electronic apparatus including a first member and a second member. The first member has an opening through which air passes. The opening opens in a first direction. The second member is mounted to an outside of the first member. The second member includes a plurality of guide portions. The guide portions are disposed in juxtaposition with each other in a second direction that extends orthogonally to the first direction when viewed in the first direction. The guide portions guide air flowing through the opening. At least one guide portion out of the plurality of guide portions includes an engagement portion to be hooked onto the first member and the second member is mounted to the first member through the engagement portion. In accordance with the present disclosure, the member including a guide can be mounted to the electronic apparatus, while minimizing an effect on appearance of the electronic apparatus.

DETAILED DESCRIPTION OF THE PREFERRED EMBODIMENT

Figure 1:
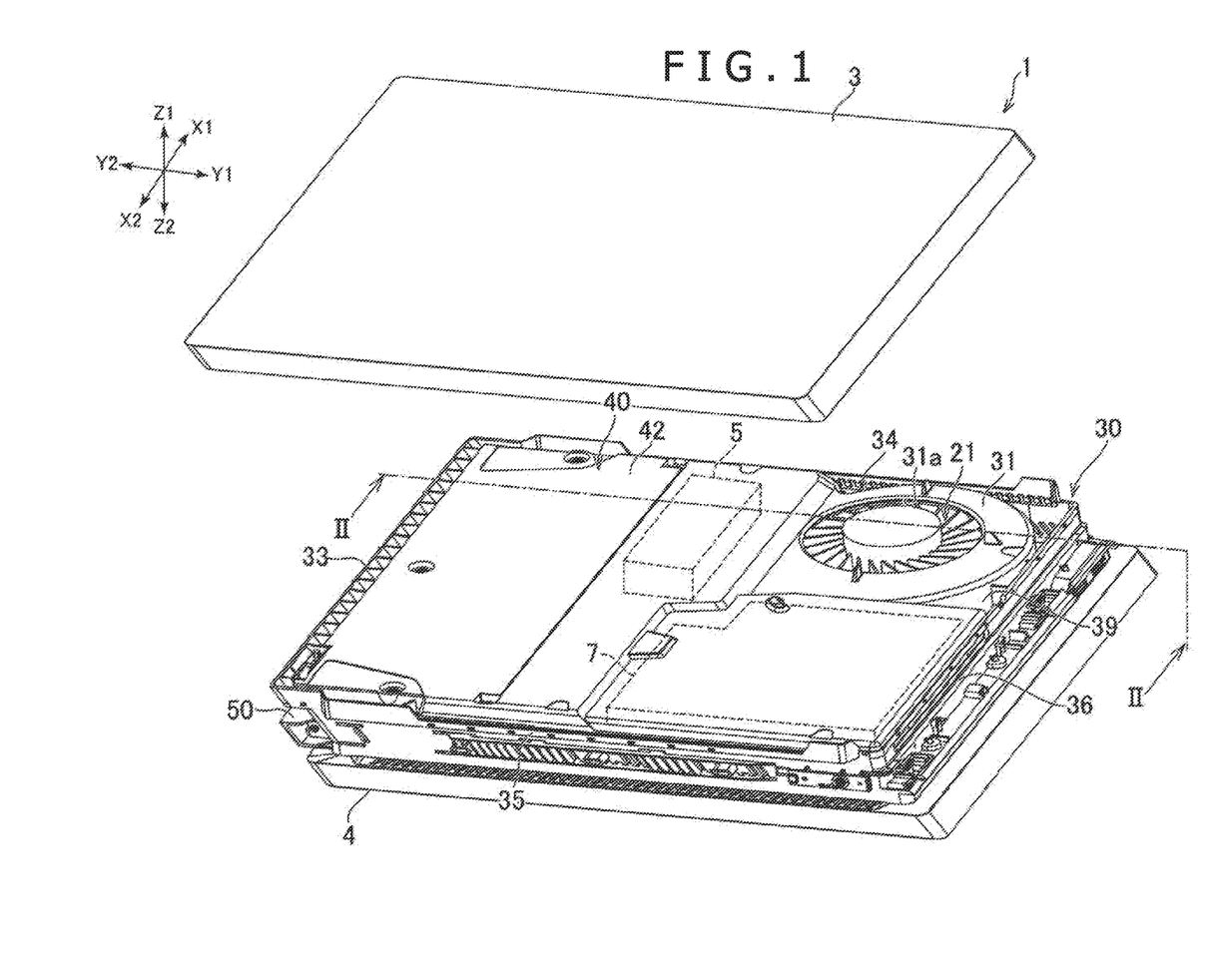
FIG. 1 is an exploded perspective view of an electronic apparatus according to an embodiment of the present disclosure.
Figure 2:
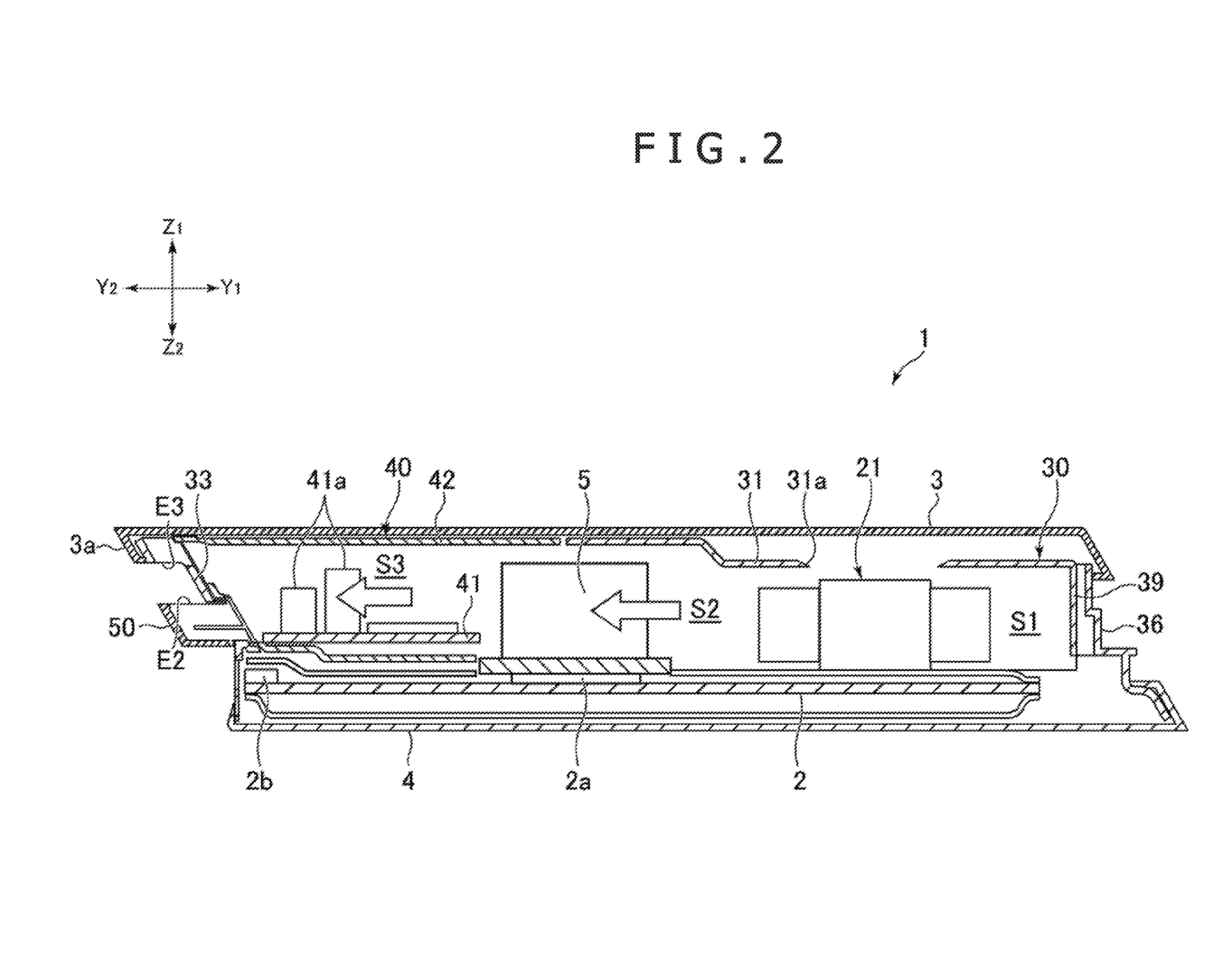
FIG. 2 is a cross-sectional view of the electronic apparatus, taken along line II-II in FIG. 1.
Figure 3:
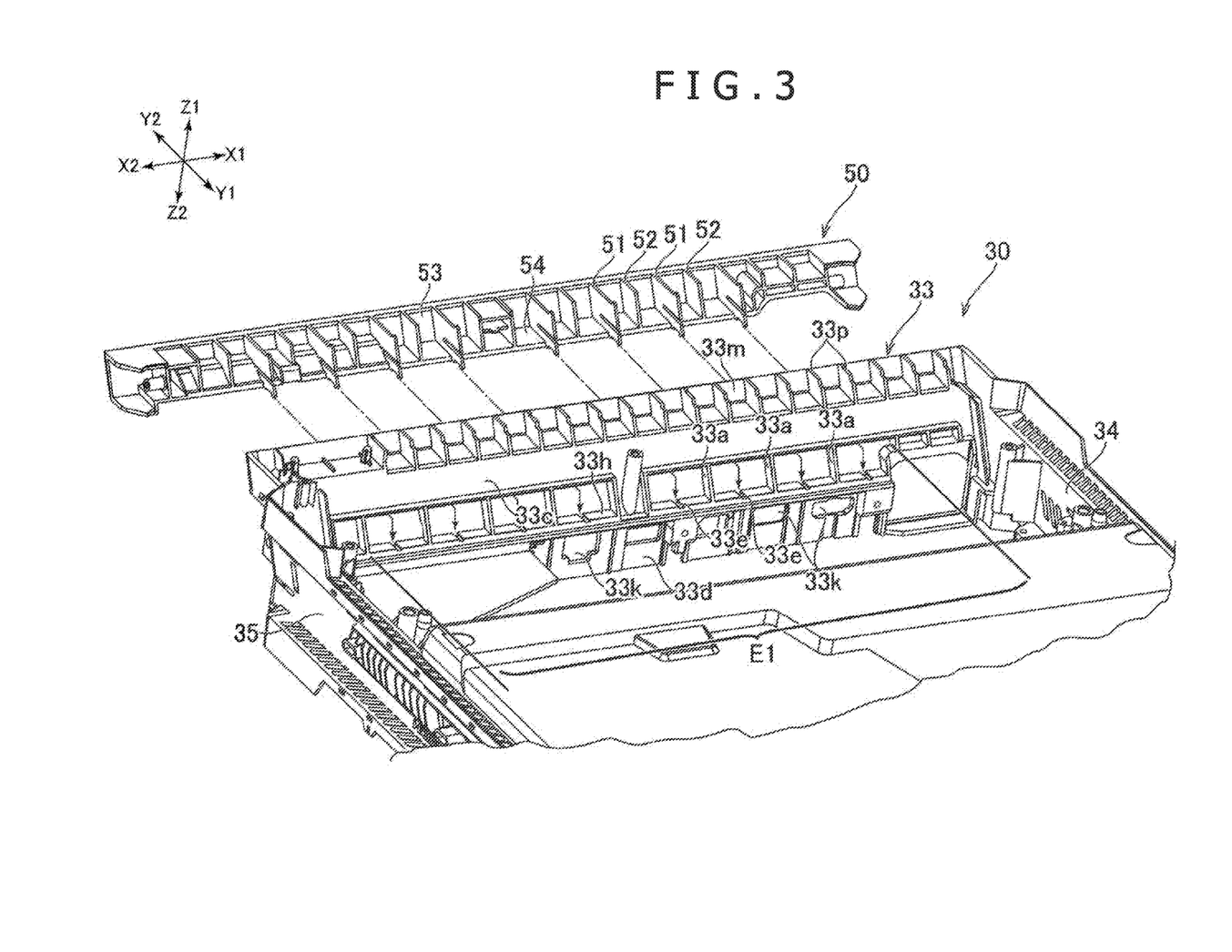
FIG. 3 is an exploded perspective view of a frame and a shield member.
Figure 4:
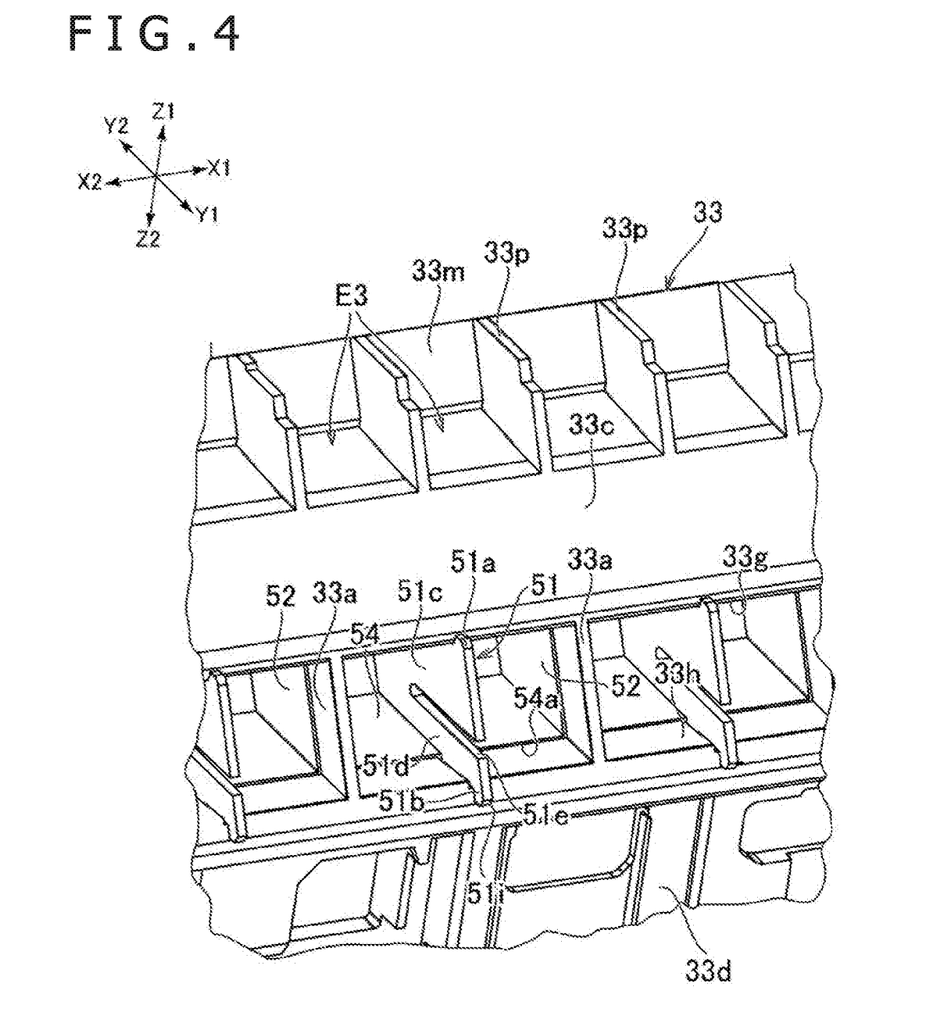
FIG. 4 is an enlarged perspective view of a posterior wall portion of the frame on which the shield member is mounted.
Figure 5:
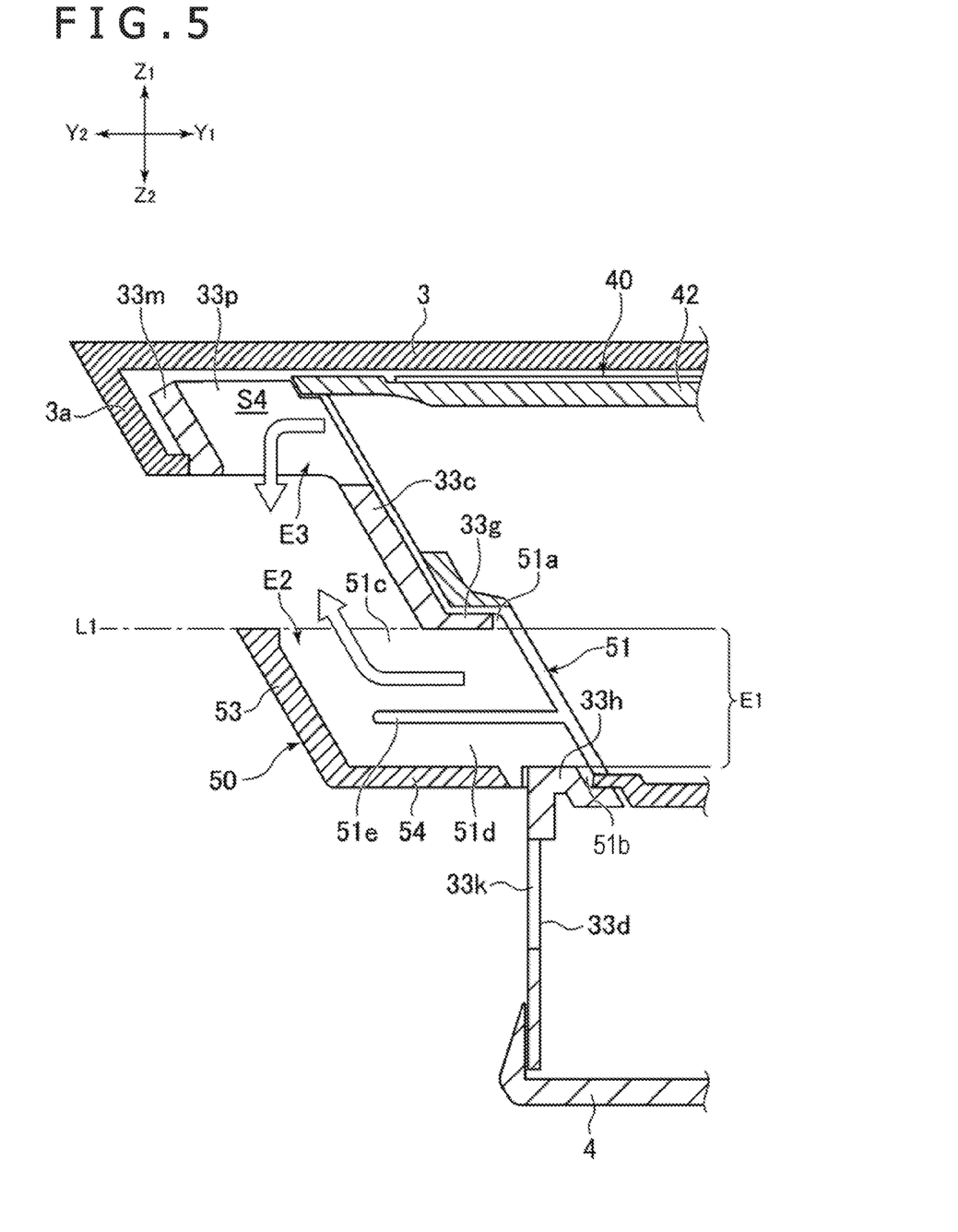
FIG. 5 is an enlarged view of main parts shown in FIG. 2.

An embodiment of the present disclosure will be described below. FIG. 1 is an exploded perspective view of an electronic apparatus 1 according to an embodiment of the present disclosure. FIG. 1 shows the electronic apparatus 1 from which a superior cover 3 constituting a superior surface has been removed. FIG. 2 is a cross-sectional view of the electronic apparatus 1, taken along line II-II in FIG. 1. FIG. 3 is an exploded perspective view of a frame 30 and a shield member 50. FIG. 4 is an enlarged perspective view of a posterior wall portion 33 of the frame 30 on which the shield member 50 is mounted. FIG. 5 is an enlarged view of main parts shown in FIG. 2.

Directional expressions as used herein are here defined as follows with reference to the electronic apparatus 1 viewed from the right-hand side in FIG. 1. Specifically, arrows X1 and X2 shown in FIG. 1 represent rightward and leftward directions, respectively; arrows Y1 and Y2 shown in FIG. 1 represent anterior and posterior directions, respectively; and arrows Z1 and Z2 shown in FIG. 1 represent superior and inferior directions, respectively.

The electronic apparatus 1 is, for example, an entertainment apparatus that functions as a gaming machine or an audio-visual device. The electronic apparatus 1 outputs to a display device such as a television set moving image data generated through execution of a game program, image and audio data acquired from a recording medium such as an optical disc, and/or image and audio data acquired over a network. The electronic apparatus 1 is not limited to the entertainment apparatus such as the gaming machine, also may be a personal computer.

Reference is made to FIG. 2. The electronic apparatus 1 includes a circuit substrate 2. A plurality of integrated circuits 2a that function as, for example, a central processing unit (CPU), a graphics processing unit (GPU), and a memory are mounted on the circuit substrate 2. The electronic apparatus 1 further includes a cooling fan 21 that forms an air flow for cooling, for example, the integrated circuits 2a and components 41a that constitute a power circuit to be described later. In the electronic apparatus 1, the cooling fan 21 exemplarily rotates about an axis extending in a superior-inferior direction.

As shown in FIG. 1, the electronic apparatus 1 includes an optical disc drive 7. In the electronic apparatus 1, the optical disc drive 7 and the cooling fan 21 are exemplarily disposed at an anterior portion of the electronic apparatus 1. A power unit 40 that includes a power circuit is disposed posterior to the optical disc drive 7 and the cooling fan 21. The power circuit uses electricity received from an external power source to thereby supply the integrated circuits 2a, the cooling fan 21, and the optical disc drive 7 with drive power therefor. Layout of the cooling fan 21, the optical disc drive 7, and the power unit 40 in the electronic apparatus 1 is illustrative only and may be changed as appropriate.

The electronic apparatus 1 includes an exterior member that constitutes an exterior of the electronic apparatus 1. As shown in FIG. 1, in the electronic apparatus 1, the exterior member exemplarily includes the superior cover 3 that constitutes the superior surface of the electronic apparatus 1, an inferior cover 4 that constitutes an inferior surface of the electronic apparatus 1, and the frame 30 that surrounds components incorporated in the electronic apparatus 1. In the electronic apparatus 1, the frame 30 exemplarily surrounds, for example, the cooling fan 21, the power unit 40, and the optical disc drive 7 mentioned previously. The cooling fan 21, the power unit 40, the optical disc drive 7, and the circuit substrate 2 are mounted, for example, on the frame 30. Reference is made to FIG. 3. The frame 30 includes a posterior wall portion 33, a right wall portion 34, a left wall portion 35, and an anterior wall portion 36 (see FIG. 1). Specifically, the posterior wall portion 33 is disposed posterior to the components incorporated in the electronic apparatus 1. The right wall portion 34 extends anteriorly from a right end of the posterior wall portion 33. The left wall portion 35 extends anteriorly from a left end of the posterior wall portion 33. The anterior wall portion 36 is formed between an anterior end of the right wall portion 34 and an anterior end of the left wall portion 35. The exterior member including the frame 30, the superior cover 3, and the inferior cover 4 is formed, for example, of a resin such as an acrylonitrile butadiene styrene (ABS) resin or a polycarbonate. The components of the exterior member in the electronic apparatus 1 are illustrative only and not limiting. For example, the electronic apparatus may include as the exterior member a box-shaped superior housing that is open inferiorly and a box-shaped inferior housing that is open superiorly and combined with the superior housing in the superior-inferior direction. Specifically, the exterior member of the electronic apparatus may not include a frame. As will be later detailed, the posterior wall portion 33 of the frame 30 has an opening E1 formed therein for exhausting to the outside air that is exposed to heat generated by, for example, the integrated circuits 2a.

Reference is made to FIG. 2. Air passages S1 to S3 that extend from the cooling fan 21 to the opening E1 (see FIG. 5) are defined inside the electronic apparatus 1. A first air passage S1 is formed around the cooling fan 21. A wall portion 39 (see FIG. 1) that is arcuately curved to surround the cooling fan 21 is formed around the cooling fan 21. The first air passage S1 is defined between an outer periphery of the cooling fan 21 and the wall portion 39. In the electronic apparatus 1, the wall portion 39 is exemplarily formed integrally with the frame 30. The frame 30 includes a covering portion 31 that covers a superior side of the cooling fan 21. The covering portion 31 has an opening 31a disposed superior to the cooling fan 21. When the cooling fan 21 is driven, air is introduced into the cooling fan 21 through the opening 31a. As the cooling fan 21 is driven, the air flows to the first air passage S1 and further toward the posterior through the first air passage S1. In the electronic apparatus 1, the covering portion 31 is exemplarily joined with an anterior portion of the right wall portion 34 of the frame 30, an anterior portion of the left wall portion 35 of the frame 30, and the anterior wall portion 36 of the frame 30, to thereby cover not only the cooling fan 21, but also the optical disc drive 7. The shape of the frame 30 in the electronic apparatus 1 is illustrative only and not limiting, and may be changed as appropriate.

Reference is made to FIG. 2. The electronic apparatus 1 includes a second air passage S2 to which the first air passage S1 leads. In the electronic apparatus 1, the second air passage S2 is exemplarily disposed posterior to the first air passage S1. The second air passage S2 is also covered in the covering portion 31 included in the frame 30. In addition, the frame 30 includes the right wall portion and the left wall portion that define the second air passage S2.

Reference is made to FIG. 2. The electronic apparatus 1 further includes a third air passage S3 to which the second air passage S2 leads. In the electronic apparatus 1, the third air passage S3 is exemplarily defined by a case 42 of the power unit 40. The case 42 is connected with the wall portions that define the second air passage S2 and with the covering portion 31. A circuit substrate 41 on which the components 41a that constitute the power circuit is mounted is disposed inside the case 42.

The electronic apparatus 1 includes heat-generating components that are cooled by an air flow formed by the first to third air passages S1 to S3. Examples of the heat-generating components include, but are not limited to, the integrated circuits 2a, and the components 41a that constitute the power circuit (e.g., a transformer). As shown in FIG. 2, the electronic apparatus 1 includes a heat sink 5 that is exemplarily disposed superior to the integrated circuits 2a. The heat sink 5 is exemplarily disposed in the second air passage S2. Additionally, as described above, the third air passage S3 is defined by the case 42 of the power unit 40. The components 41a that constitute the power circuit are cooled by the air that passes through the third air passage S3. The components disposed in the first to third air passages S1 to S3 in the electronic apparatus 1 are illustrative only and not limiting, and may be changed as appropriate.

Reference is made to FIG. 5. The electronic apparatus 1 has the opening E1 formed at the most downstream portion of the first to third air passages S1 to S3. The opening E1 opens toward the posterior. Air in the first to third air passages S1 to S3 is exhausted to the outside through the opening E1. In the electronic apparatus 1, the opening E1 is formed exemplarily in the exterior member of the electronic apparatus 1. More specifically, as shown in FIG. 4, the opening E1 is formed in the posterior wall portion 33 of the frame 30 as one component of the exterior member. The posterior wall portion 33 is disposed posterior to the case 42 that constitutes the third air passage S3. The case 42 of the power unit 40 opens to the posterior and the opening of the case 42 has an edge connected with the posterior wall portion 33. In the electronic apparatus 1, the opening E1 has a rectangular shape extending slenderly in a lateral direction.

Reference is made to FIG. 3. In the electronic apparatus 1, the posterior wall portion 33 of the frame 30 exemplarily includes an intermediate wall portion 33c and an inferior wall portion 33d. The intermediate wall portion 33c is disposed superior to the opening E1. The inferior wall portion 33d is disposed inferior to the opening E1. A plurality of partitions 33a are formed in juxtaposition with each other in the lateral direction between an inferior edge of the intermediate wall portion 33c and a superior edge of the inferior wall portion 33d. The inferior wall portion 33d has a plurality of openings 33k through which a plurality of connectors 2b (see FIG. 2) mounted on the circuit substrate 2 are individually exposed to the posterior. As shown in FIG. 5, in the electronic apparatus 1, an air passage S4 is exemplarily defined superior to the intermediate wall portion 33c. The air passage S4 will be detailed later.

Reference is made to FIG. 3. The electronic apparatus 1 includes the shield member 50 that is mounted externally on a main unit of the electronic apparatus 1. The main unit of the electronic apparatus 1 includes, for example, the exterior member including the frame 30, the power unit 40, the cooling fan 21, and the first to third air passages S1 to S3 described previously. The shield member 50 is mounted, specifically, on the outside of a member having the opening E1. In the electronic apparatus 1, the shield member 50 is exemplarily mounted to the frame 30 that is one component of the exterior member. The shield member 50 is molded separately from the frame 30. In the example of the electronic apparatus 1, the frame 30 corresponds to the "first member" in "WHAT IS CLAIMED IS" and the shield member 50 corresponds to the "second member" in "WHAT IS CLAIMED IS."

Reference is made to FIG. 5. The shield member 50 is configured so as to prevent the inside of the electronic apparatus 1 when viewed from the posterior side of the electronic apparatus 1 from being exposed to the outside through the opening E1. In the electronic apparatus 1, the case 42 of the power unit 40 is disposed anterior to the posterior wall portion 33 in which the opening E1 is formed. The shield member 50 prevents the inside of the case 42, specifically, the components 41a (see FIG. 2) that constitute the power circuit from being exposed to the outside. The shield member 50 includes a shield wall portion 53 that is spaced posterior from the opening E1. Specifically, the shield wall portion 53 is spaced posterior from an inferior edge portion 33g of the intermediate wall portion 33c and a superior edge portion 33h of the inferior wall portion 33d. The inferior edge portion 33g and the superior edge portion 33h constitute the opening E1. In addition, the shield wall portion 53 is disposed inferior to the intermediate wall portion 33c and superior to the inferior wall portion 33d. Thereby, the shield wall portion 53 covers the opening E1. The foregoing arrangements enable the shield wall portion 53 to prevent the inside of the case 42 from being exposed when the electronic apparatus 1 is viewed from the posterior side. In the electronic apparatus 1, the shield wall portion 53 exemplarily has a width in a superior-inferior direction corresponding to a width in the superior-inferior direction of the opening E1. The shield wall portion 53 has a superior edge disposed on a straight line L1 that passes through the inferior edge portion 33g of the intermediate wall portion 33c. In addition, the shield wall portion 53 has a width in the lateral direction corresponding to a width in the lateral direction of the opening E1, specifically, a width in the lateral direction of the posterior wall portion 33. It is noted that the shield wall portion 53 may have the superior edge disposed superior to the straight line L1.

Reference is made to FIG. 5. In the electronic apparatus 1, the shield member 50 exemplarily includes a bottom portion 54 that extends anteriorly from an inferior edge of the shield wall portion 53. The bottom portion 54 has an anterior edge 54a (see FIG. 4) connected with the posterior wall portion 33 of the frame 30. More specifically, the anterior edge 54a of the bottom portion 54 is connected with the superior edge portion 33h of the inferior wall portion 33d of the posterior wall portion 33. The shield member 50 may not include the bottom portion 54.

Reference is made to FIG. 3. The shield member 50 includes a plurality of guide portions 51 and 52. The guide portions 51 and 52 are disposed in juxtaposition with each other in the lateral direction. The guide portions 51 and 52 guide air flows through the opening E1. The guide portions 51 and 52 are disposed in a direction in which air flows through the opening E1. In the electronic apparatus 1, the guide portions 51 and 52 are exemplarily disposed posterior to the opening E1, guiding the air that passes through the opening E1 so as to flow posteriorly. The guide portions 51 and 52 each extend in the anterior-posterior direction. The guide portions 51 and 52 may be inclined to the right or left.

The guide portions 51 and 52 each have a plate shape. The guide portions 51 and 52 each have a width in the superior-inferior direction corresponding to a width in the superior-inferior direction of the opening E1. The guide portions 51 and 52, having configurations as described above, can prevent the inside of the case 42 from being visible when, for example, the posterior side of the electronic apparatus 1 is viewed from an obliquely right direction or from an obliquely left direction.

In the electronic apparatus 1, the shield member 50 exemplarily includes a plurality of first guide portions 51 and a plurality of second guide portions 52. As shown in FIG. 5, the first guide portions 51 each include engagement portions 51a and 51b. The engagement portions 51a and 51b are hooked onto the main unit of the electronic apparatus 1 so that the shield member 50 is not separated from the main unit. In the electronic apparatus 1, the engagement portions 51a and 51b are exemplarily hooked onto the exterior member of the electronic apparatus 1 so that the shield member 50 is not separated posteriorly from the exterior member. More specifically, the engagement portions 51a and 51b are hooked onto the posterior wall portion 33 of the frame 30. The foregoing structure allows the shield member 50 to be mounted to the electronic apparatus 1 without the need to use a screw or other fastener, or using a fewer number of fasteners. Appearance of the electronic apparatus 1 can thereby be improved. Additionally, the shield member 50 can have a central portion in the lateral direction mounted to the frame 30 using the first guide portions 51. As a result, the shield member 50 can be prevented from being deformed such that the central portion thereof is separated from the frame 30.

Reference is made to FIG. 5. The first guide portions 51 each extend anteriorly from the shield wall portion 53 and have a foremost part disposed inside the opening E1. The engagement portions 51a and 51b are formed at an anterior end of the first guide portion 51 and hooked at an edge of the opening E1. In the electronic apparatus 1, the first guide portion 51 exemplarily includes two engagement portions 51a and 51b formed at the anterior end thereof. A protrusion that protrudes superiorly is formed as a first engagement portion 51a at the anterior end of the first guide portion 51. The protrusion as the first engagement portion 51a is caught at an edge on a superior side of the opening E1, specifically, the inferior edge portion 33g of the intermediate wall portion 33c of the posterior wall portion 33. More specifically, the protrusion as the first engagement portion 51a is caught at an anterior end of the inferior edge portion 33g. Additionally, a protrusion that protrudes inferiorly is formed as a second engagement portion 51b at the anterior end of the first guide portion 51. The protrusion as the second engagement portion 51b is caught at an edge on an inferior side of the opening E1, specifically, the superior edge portion 33h of the inferior wall portion 33d of the posterior wall portion 33. More specifically, the protrusion as the second engagement portion 51b is caught at an anterior end of the superior edge portion 33h.

The shield member 50 is mounted to the exterior member of the electronic apparatus 1, specifically, the frame 30 through the engagement portions 51a and 51b. In accordance with the foregoing mounting structure, the engagement portions 51a and 51b do not serve to block the air flow through the opening E1. In the electronic apparatus 1, screws or any other fasteners are not exemplarily used to mount the shield member 50 on the posterior wall portion 33 of the frame 30. Instead of the example illustrated in the electronic apparatus 1, however, screws or any other fasteners may be used to mount the shield member 50. In this case, too, the use of the first guide portions 51 allows the number of fasteners to be decreased. As a result, appearance of the electronic apparatus 1 can be improved.

Reference is made to FIG. 5. The first guide portions 51 each include a superior portion 51c and an inferior portion 51d that are spaced apart from each other in the superior-inferior direction. The first guide portions 51 each have a slit 51e formed therein to extend from an anterior end toward the posterior. The superior portion 51c is disposed superior to the slit 51e and the inferior portion 51d is disposed inferior to the slit 51e. The first engagement portion 51a is formed at an anterior end of the superior portion 51c. The second engagement portion 51b is formed at an anterior end of the inferior portion 51d. As described previously, the shield member 50 includes the bottom portion 54. The inferior portion 51d of the first guide portion 51 has an inferior edge connected with the bottom portion 54. The inferior portion 51d has a foremost part extending anteriorly beyond the anterior edge 54a (see FIG. 4) of the bottom portion 54.

The first guide portion 51 is elastically deformable such that the superior portion 51c and the inferior portion 51d can be brought close to each other in the superior-inferior direction. This structure facilitates mounting of the shield member 50 on the main unit of the electronic apparatus 1. Specifically, in the assembly work of the electronic apparatus 1, elastically deforming the first guide portions 51 allows the shield member 50 to be mounted in the edge of the opening E1 in the frame 30. In one example of the electronic apparatus 1, both the superior portion 51c and the inferior portion 51d are elastically deformable in the superior-inferior direction. Specifically, the superior portion 51c is elastically deformable such that the first engagement portion 51a moves inferiorly and the inferior portion 51d is elastically deformable such that the second engagement portion 51b moves superiorly. In another example of the electronic apparatus 1, only either the superior portion 51c or the inferior portion 51d may be elastically deformable in the superior-inferior direction.

Reference is made to FIG. 4. The second engagement portion 51b of the inferior portion 51d has an inclined surface 51i. The inclined surface 51i extends inferiorly and posteriorly. The foregoing arrangement further facilitates the assembly work of the electronic apparatus 1. For example, the first engagement portion 51a of the superior portion 51c is first caught by the edge of the opening E1 and the inclined surface 51i of the inferior portion 51d is thereafter brought into abutment with the edge of the opening E1. The foregoing procedure causes the inferior portion 51d to be elastically deformed superiorly to thereby move into the inside of the opening E1. The second engagement portion 51b is then caught by the edge of the opening E1, specifically, the anterior edge of the superior edge portion 33h of the inferior wall portion 33d.

The first guide portions 51 engage with the frame 30 so as to prevent the shield member 50 from being deviated in the lateral direction with respect to the frame 30. As shown in FIG. 3, in the electronic apparatus 1, recesses (grooves) 33e are exemplarily formed in the edge of the opening E1. To state the foregoing differently, the posterior wall portion 33 of the frame 30 has the recesses 33e formed in the superior edge portion 33h of the inferior wall portion 33d. The recesses 33e extend from an anterior edge to a posterior edge of the superior edge portion 33h. Inferior edges of the first guide portions 51, more specifically, inferior edges of the foremost parts of the inferior portions 51d are disposed in the respective recesses 33e. This arrangement can prevent the shield member 50 from being deviated in the lateral direction with respect to the frame 30.

The structure that prevents the shield member 50 from being deviated in the lateral direction in the example of the electronic apparatus 1 is illustrative only and not limiting. For example, the posterior wall portion 33 of the frame 30 may have recesses formed in an inferior edge of the intermediate wall portion 33c. The recesses extend from an anterior edge to a posterior edge of the intermediate wall portion 33c. In this case, superior edges of the first guide portions 51, more specifically, superior edges of the superior portions 51c are disposed in the respective recesses in the intermediate wall portion 33c. This arrangement can also prevent the shield member 50 from being deviated in the lateral direction with respect to the frame 30.

As described above, the shield member 50 includes the first guide portions 51 each being spaced apart from each other in the lateral direction. This arrangement can achieve mounting strength of the shield member 50 with respect to the frame 30. The shield member 50 further includes the second guide portions 52. As shown in FIG. 3, unlike the first guide portions 51, the second guide portions 52 do not include the engagement portions that are to be caught by the frame 30. The second guide portions 52, and the first guide portions 51, are arranged in juxtaposition with each other in the lateral direction. Specifically, one or a plurality of second guide portions 52 are disposed between two adjacent first guide portions 51. This arrangement can facilitate the mounting work of the shield member 50. Specifically, varying the ratio of the second guide portions 52 in a plurality of guide portions allows a force for mounting the shield member 50 to be adjusted. For example, the force for mounting the shield member 50 can be reduced by increasing the ratio of the second guide portions 52 while decreasing the ratio of the first guide portions 51.

In the electronic apparatus 1, one second guide portion 52 is formed between two adjacent first guide portions 51. As shown in FIG. 4, the second guide portions 52 are disposed in tandem with the respective partitions 33a of the posterior wall portion 33 in the anterior-posterior direction. This arrangement can prevent the second guide portions 52 from resisting air flow. It is noted that the number of second guide portions 52 disposed between two adjacent first guide portions 51 in the example of the electronic apparatus 1 is illustrative only and not limiting and may be two or three.

As described above, the electronic apparatus 1 includes the intermediate wall portion 33c that constitutes the edge of the opening E1. In the electronic apparatus 1, the intermediate wall portion 33c is exemplarily included in the posterior wall portion 33 of the frame 30. As shown in FIG. 5, the shield wall portion 53 of the shield member 50 is spaced posteriorly from the intermediate wall portion 33c. Thus, an opening E2 that opens superiorly is formed between the inferior edge portion 33g of the intermediate wall portion 33c and the shield wall portion 53. Air in the third air passage S3 flows through the opening E2 between the intermediate wall portion 33c and the shield wall portion 53 to be exhausted to the outside. This structure can smoothly discharge the air, while preventing the inside of the main unit of the electronic apparatus 1, specifically, the inside of the case 42 of the power unit 40 from being exposed to the outside. For example, widening a gap between the intermediate wall portion 33c and the shield wall portion 53 can enhance air exhaust efficiency without allowing the inside of the case 42 to be exposed.

Reference is made to FIG. 5. In the electronic apparatus 1, the intermediate wall portion 33c and the shield wall portion 53 are inclined. Specifically, the intermediate wall portion 33c and the shield wall portion 53 extend obliquely posteriorly and superiorly. The intermediate wall portion 33c and the shield wall portion 53 are disposed so as not to overlap each other in a plan view. Specifically, the shield wall portion 53 has an anterior end (inferior end) disposed posterior to a posterior end (superior end) of the intermediate wall portion 33c.

Reference is made to FIG. 5. In the electronic apparatus 1, the air passage S4 is exemplarily formed superior to the intermediate wall portion 33c. The exterior member of the electronic apparatus 1 includes a shield wall portion 3a that is disposed posterior to the superior edge of the intermediate wall portion 33c. The shield wall portion 3a can prevent the inside of the case 42 of the power unit 40 from being exposed to the outside through the air passage S4. In the electronic apparatus 1, the shield wall portion 3a is exemplarily molded integrally with the superior cover 3. The shield wall portion 3a is disposed superior to the intermediate wall portion 33c. An opening E3 that opens inferiorly is formed between an inferior edge of the shield wall portion 3a and the superior edge of the intermediate wall portion 33c. Air in the case 42 (specifically, the third air passage S3) flows through the opening E3 between the shield wall portion 3a of the superior cover 3 and the intermediate wall portion 33c and through the opening E2 between the intermediate wall portion 33c and the shield wall portion 53 of the shield member 50 to thereby be exhausted to the outside.

In the electronic apparatus 1, the shield wall portion 3a of the superior cover 3 is exemplarily inclined as with the intermediate wall portion 33c of the frame 30 and the shield wall portion 53 of the shield member 50. Specifically, as shown in FIG. 5, the shield wall portion 3a of the superior cover 3 extends obliquely posteriorly and superiorly in a cut plane taken in the anterior-posterior direction.

Additionally, in the electronic apparatus 1, the posterior wall portion 33 of the frame 30 exemplarily includes a superior wall portion 33m that is disposed superior to, and posterior to, the intermediate wall portion 33c. The superior wall portion 33m is disposed inside the shield wall portion 3a of the superior cover 3. Reference is made to FIG. 3. The posterior wall portion 33 includes a plurality of guide portions 33p that are disposed in juxtaposition with each other in the lateral direction. The guide portions 33p extend anteriorly from the superior wall portion 33m and connect to the superior edge of the intermediate wall portion 33c.

As described above, the electronic apparatus 1 includes the shield member 50. The shield member 50 includes the first and second guide portions 51 and 52 that are disposed in juxtaposition with each other in the lateral direction and that guide air passing through the opening E1 formed in the frame 30. Of the first and second guide portions 51 and 52, the first guide portions 51 each include the engagement portions 51a and 51b that are hooked onto the posterior wall portion 33 of the frame 30. The shield member 50 is mounted to the frame 30 via the engagement portions 51a and 51b. In accordance with the electronic apparatus 1, the shield member 50 can be mounted to the electronic apparatus 1 without the need to use a screw or other fastener, or using a fewer number of fasteners. Appearance of the electronic apparatus 1 can thus be improved.

It should be noted that the present disclosure is not limited to the electronic apparatus 1 according to the above-described embodiment and may include various modifications.

For example, the shield member 50, though including the multiple first guide portions 51, may include one first guide portion 51.

The first guide portions 51 each have protrusions formed as the engagement portions 51a and 51b. The engagement portions 51a and 51b may, however, not necessarily be protrusions. The engagement portions 51a and 51b have a structure that allows the engagement portions 51a and 51b to be caught by the posterior wall portion 33 so as not to be separated posteriorly from the posterior wall portion 33 of the frame 30. For example, the opening E1 may have protrusions formed at the edge thereof and the first guide portions 51 may have recesses formed therein as engagement portions, so that the protrusions can be caught in the recesses.

In the electronic apparatus 1, the engagement portions 51a and 51b of the first guide portions 51 are exemplarily hooked onto the posterior wall portion 33 of the frame 30. The engagement portions 51a and 51b of the first guide portions 51 may nonetheless be hooked onto another member. For example, the first guide portions 51 may extend anteriorly further ahead of the edge of the opening E1. The second engagement portions 51b formed at the anterior ends of the inferior ends of the first guide portions 51 may even be hooked onto a part covered in the frame 30, the superior cover 3, and the inferior cover 4, for example, the case 42 of the power unit 40. Specifically, the case 42 may be used as the "first member" in "WHAT IS CLAIMED IS."

Additionally, the shield member 50 may include a plurality of louvers in place of the shield wall portion 53. The louvers are disposed in juxtaposition with each other along the superior-inferior direction. Preferably, the louvers are inclined such that the inside of the case 42 of the power unit 40 is not visible. In this case, the shield member 50 includes the first and second guide portions 51 and 52 that are disposed in juxtaposition with each other in the lateral direction along the louvers. The superior edges and the inferior edges of the first guide portions 51 may then have the anterior ends engaged with the exterior member of the electronic apparatus 1.

The present disclosure contains subject matter related to that disclosed in Japanese Priority Patent Application JP 2016-152222 filed in the Japan Patent Office on Aug. 2, 2016, the entire content of which is hereby incorporated by reference.

It should be understood by those skilled in the art that various modifications, combinations, sub-combinations and alterations may occur depending on design requirements and other factors insofar as they are within the scope of the appended claims or the equivalents thereof.

What is claimed is:
1. An electronic apparatus comprising:
a first member having an opening through which air passes, the opening in a first direction; and
a second member mounted to an outside of the first member, the second member including a plurality of guide portions disposed in juxtaposition with each other in a second direction that extends orthogonally to the first direction when viewed in the first direction, the guide portions guiding air flowing through the opening,
at least one guide portion out of the plurality of guide portions including an engagement portion to be hooked onto the first member,
the second member being mounted to the first member through the engagement portion, wherein:

the second member includes a shield wall portion that is spaced away in the first direction from an edge of the opening in the first member and that covers the opening, and the guide portions extend from the shield wall portion toward the opening.

2. The electronic apparatus according to claim 1, wherein the at least one guide portion extends into an inside of the opening and is hooked onto an edge of the opening by the engagement portion.

3. The electronic apparatus according to claim 1, wherein the guide portions include, as the at least one guide portion, a plurality of first guide portions disposed to be spaced apart from each other in the second direction.

4. The electronic apparatus according to claim 3, wherein
the guide portions include second guide portions that do not include the engagement portions, and
the second guide portions, and the first guide portions, are disposed in juxtaposition with each other in the second direction.

5. The electronic apparatus according to claim 1, wherein the at least one guide portion is elastically deformable so that the engagement portion is movable in a third direction that is orthogonal to both the first direction and the second direction.

6. The electronic apparatus according to claim 5, wherein
the at least one guide portion includes a first portion and a second portion that are spaced apart from each other in the third direction,
the first portion and the second portion each include a respective engagement portion, and
the at least one guide portion is elastically deformable so that the first portion and the second portion can be brought close to each other in the third direction.

7. The electronic apparatus according to claim 1, wherein the at least one guide portion engages with the first member so as to prevent the second member from being deviated in the second direction with respect to the first member of the electronic apparatus.

8. The electronic apparatus according to claim 1, wherein
the second member includes a shield wall portion that is spaced away in the first direction from an edge of the opening in the first member and that covers the opening, and
the guide portions extend from the shield wall portion toward the opening.

9. The electronic apparatus according to claim 1, wherein the at least one guide portion engages with the first member so as to prevent the second member from being deviated in the second direction with respect to the first member of the electronic apparatus.

10. An electronic apparatus comprising:
a first member having an opening through which air passes, the opening in a first direction; and
a second member mounted to an outside of the first member, the second member including a plurality of guide portions disposed in juxtaposition with each other in a second direction that extends orthogonally to the first direction when viewed in the first direction, the guide portions guiding air flowing through the opening, wherein:
at least one guide portion out of the plurality of guide portions including an engagement portion to be hooked onto the first member,
the second member being mounted to the first member through the engagement portion,
the at least one guide portion is elastically deformable so that the engagement portion is movable in a third direction that is orthogonal to both the first direction and the second direction,
the at least one guide portion includes a first portion and a second portion that are spaced apart from each other in the third direction,
the first portion and the second portion each include a respective engagement portion, and
the at least one guide portion is elastically deformable so that the first portion and the second portion can be brought close to each other in the third direction.

11. The electronic apparatus according to claim 10, wherein the at least one guide portion extends into an inside of the opening and is hooked onto an edge of the opening by the engagement portion.

12. The electronic apparatus according to claim 10, wherein the guide portions include, as the at least one guide portion, a plurality of first guide portions disposed to be spaced apart from each other in the second direction.

13. The electronic apparatus according to claim 12, wherein
the guide portions include second guide portions that do not include the engagement portions, and
the second guide portions, and the first guide portions, are disposed in juxtaposition with each other in the second direction.

* * * * *